United States Patent [15] 3,663,114

Welsh et al. [45] May 16, 1972

[54] TAPE CONTROLLED AUTOMATIC MACHINE, ESPECIALLY FOR PRINTED CIRCUIT BOARDS

[72] Inventors: Alan B. Welsh; Roger T. West, both of Jasper, Ind.

[73] Assignee: Jasper Electronic Mfg. Corp, Jasper, Ind.

[22] Filed: Mar. 24, 1970

[21] Appl. No.: 22,253

[52] U.S. Cl. ....................408/3, 408/4
[51] Int. Cl. ....................B23b 39/08
[58] Field of Search ....................408/3, 4

[56] References Cited

UNITED STATES PATENTS 3,246,544 4/1966 Cooper ....................408/3

*Primary Examiner*—Francis S. Husar
*Attorney*—Melvin A. Crosby

[57] ABSTRACT

A drilling machine, especially for drilling printed circuit boards wherein the circuit boards to be drilled are mounted on a table over which is positioned a drilling spindle for each circuit board. The drilling spindles are mounted on a carriage which moves in steps at right angles to each other so as to be able to align the spindles with any hole to be drilled in the entire area of the board. A tape controlled circuit is provided which controls the movement of the carriage and the advancing and retracting of the spindles during a drilling operation. Advantageously, the table supporting the boards to be drilled can be shuttled between two opposite end positions so that while one set of boards is being drilled, another set can be mounted on the table preparatory to drilling.

12 Claims, 10 Drawing Figures

INVENTORS
ALAN B. WELSH
ROGER T. WEST

BY

[signature]

INVENTORS
ALAN B. WELSH
ROGER T. WEST

BY

Melvin A. Crosby

INVENTORS
ALAN B. WELSH
ROGER T. WEST
BY
Melvin A. Crosby

INVENTORS
ALAN B. WELSH
ROGER T. WEST
BY

INVENTORS
ALAN B. WELSH
ROGER T. WEST
BY

TAPE CONTROLLED AUTOMATIC MACHINE, ESPECIALLY FOR PRINTED CIRCUIT BOARDS

The present invention relates to a drilling machine for automatically drilling work members such as circuit boards for printed circuits.

Automatic drilling machines are known, including automatic drilling machines of the tape controlled type. However, such machines have heretofore been relatively complex and expensive and have been arranged to give fine increments of traverse. For drilling holes in circuit boards, however, larger steps of traverse can be used because the holes are spaced apart a substantial distance, say, one-tenth inch.

The automatic drilling of printed circuit boards is a desirable objective to attain because such boards are used in extremely large quantities and a great deal of manual labor is required to drill the boards. When the boards are drilled manually, the possibility is always present that one or more holes may be missed which will introduce complications when the components to be mounted on the circuit boards are connected therewith.

With the foregoing in mind, it is a primary objective of the present invention to provide a machine for automatically drilling printed circuit boards.

Another object of this invention is the provision of an automatic machine for drilling printed circuit boards which is relatively inexpensive to construct and maintain.

A still further object of this invention is the provision of a relatively inexpensive automatic machine for drilling printed circuit boards in which a plurality of boards are drilled according to identical patterns at one time.

Still another object of this invention is the provision of an automatic machine for drilling printed circuit boards in which the chips and shavings taken by the drills are automatically withdrawn from the machine so that the machine can be maintained in high speed operation with very little attendant care.

A still further object is the provision of a control circuit for a machine of the nature referred to arranged to prevent the initiation of any operation until the preceding operation is completed.

The foregoing objects as well as still other objects and advantages of the present invention will become more apparent upon reference to the following detailed specification taken in connection with the accompanying drawings, in which.

BRIEF SUMMARY OF THE INVENTION

The machine according to the present invention comprises a frame with a shuttling table therein having two operative end positions. The table is adapted for receiving circuit boards to be drilled and positioned above the table is a carriage having a spindle for each board on the table in drilling position. The spindles are adapted to reciprocate in the vertical direction on the carriage and rotate continuously and drill a hole on each vertical reciprocation thereof. The carriage is arranged to move longitudinally and transversely with respect to the circuit boards and to this end has connected thereto a pair of actuating screws which are rotated by individual actuating motors.

The screws are arranged to rotate a predetermined amount each time they are energized so that the carriage will shift relative to the board exactly the desired amount, whereby the holes drilled by the spindles will be accurately located. The operation of the screws for shifting the carriage and the reciprocation of the spindles and the shuttling of the table is under the control of an electric circuit which includes a tape sensing head adapted for having a perforated tape fed therethrough. The circuit is so arranged that each programmed step must be carried out before the next programmed step can be initiated.

DETAILED DESCRIPTION

Figure 1:
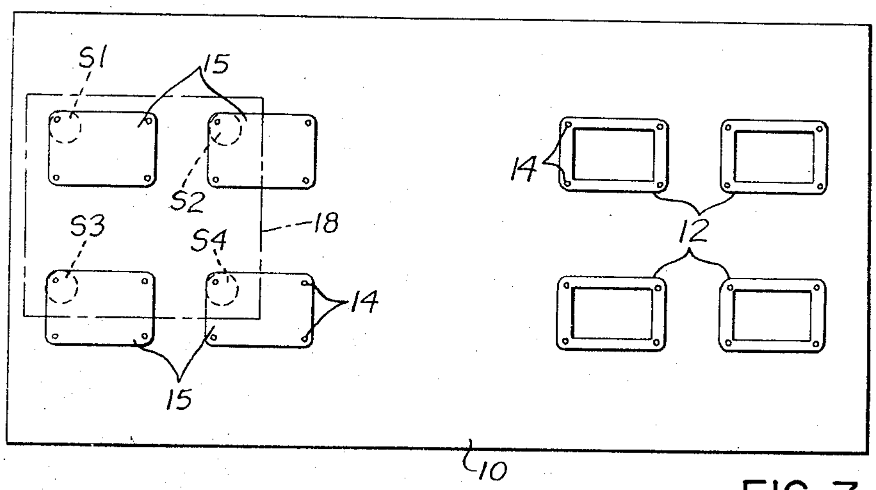
FIG. 1 is a plan view looking down on top of the table of the automatic drilling machine of the present invention, showing how circuit boards are arranged thereon preparatory to drilling.

Referring to FIG. 1, there is shown therein the table 10 of the machine which has, in two spaced relations thereon, pads or fixtures 12 having locating pins 14 thereon and adapted for having circuit boards mounted thereon. At the left side of FIG. 1, circuit boards 15 are mounted on fixtures 12 with the pins 14 extending through holes located in the circuit boards.

Positioned over table 10 is a spindle carriage, indicated by dot-dash outline 18 in FIG. 1, and which carries four spindles, indicated at S1, S2, S3 and S4, with one spindle above each circuit board at the spindle carriage end of the table. Each spindle has a respective control valve V1, V2, V3 and V4.

In operation, the carriage 18 advances in steps transversely of the circuit boards, which is in a right and left direction of FIG. 1, and also in a direction at right angles thereto, so that the drills carried by the drilling heads can be positioned over any region in which a hole is to be drilled. After the drilling carriage has completely traversed a set of circuit boards therebeneath, the carriage returns to its starting position and the table shuttles to its opposite end position so as to position a new set of circuit boards beneath the carriage. While the new set of circuit boards is being drilled, the drilled set of circuit boards are replaced by a new set to be drilled and the operation is repeated.

Figure 2:
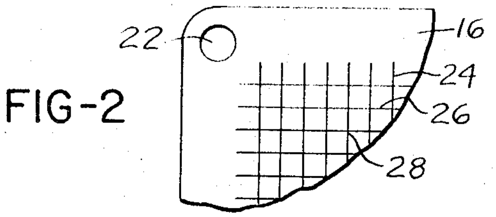
FIG. 2 is a fragmentary view, drawn at enlarged scale, showing one corner of a typical circuit board with a locating hole in the corner and with the places where holes might be drilled in the board indicated by the crossing points of the grid drawn on the board.

In FIG. 2, a corner of a typical circuit board 16 is shown at enlarged scale. The circuit board has two or more holes 22 for receiving pins 14 of the respective fixture on the table 10 of the machine. In practice, two pins are located along one edge of the board with one hole slotted to allow for expansion and contraction of the board.

On the circuit board shown in FIG. 2, is drawn a grid consisting of one set of lines 24 and a second set of lines 26 extending at right angles thereto. The lines of each set of lines are a fixed distance apart, say, one-tenth inch, and the crossing points of the lines; one of which is indicated at 28; are the locations where holes may be drilled in the circuit board. The drilling carriage 18 thus advances in steps of a tenth inch in at least one direction in moving from one drilling place to the next. There may, of course, be more than one step in one or both directions in going from one drilled hole to the next hole to be drilled, or the carriage may move only one step in one direction from one hole to the next.

Figure 4:
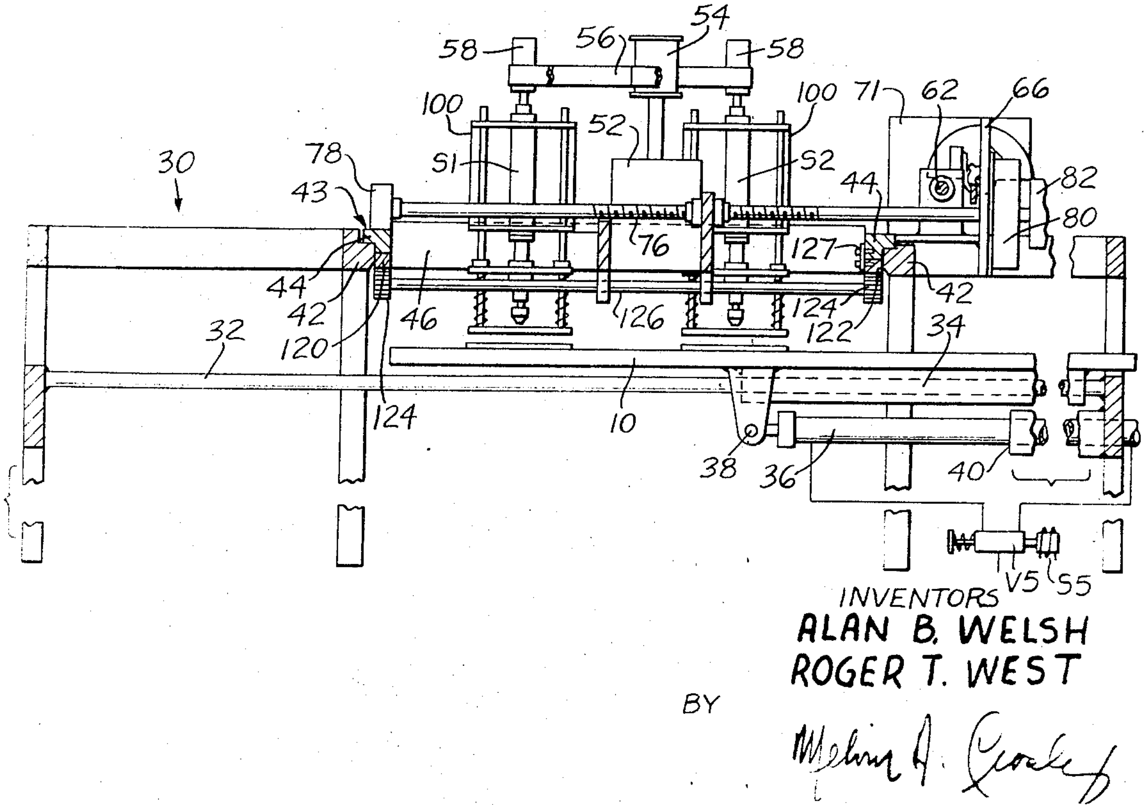
FIG. 4 is a longitudinal sectional view indicated by section line IV—IV on FIG. 3; and showing one of the screws which advances the spindle carriage in one direction over the table of the machine.
Figure 3:
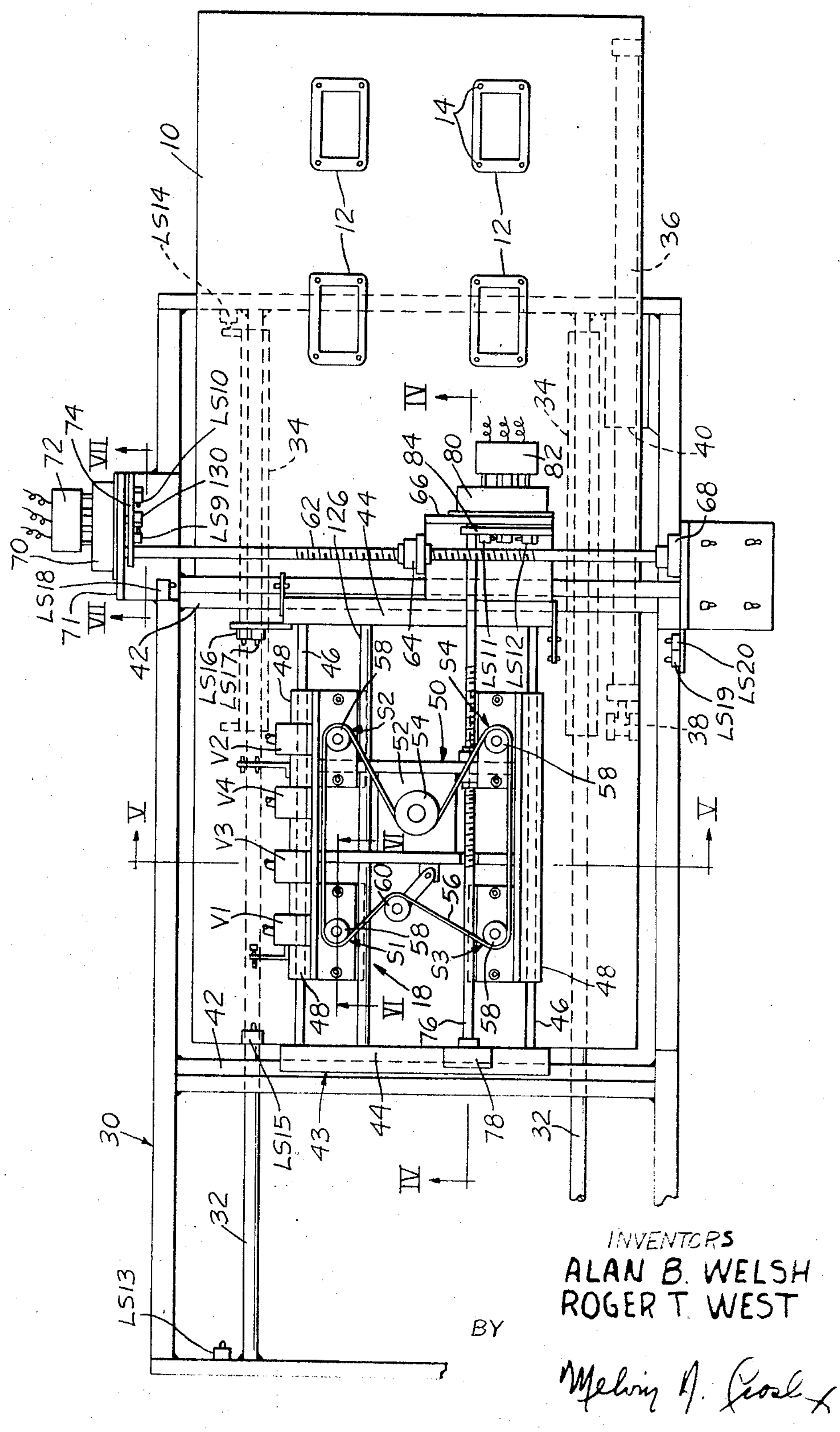
FIG. 3 is a plan view looking down on top of a drilling machine according to the present invention.
Figures 5, 6, 7A:
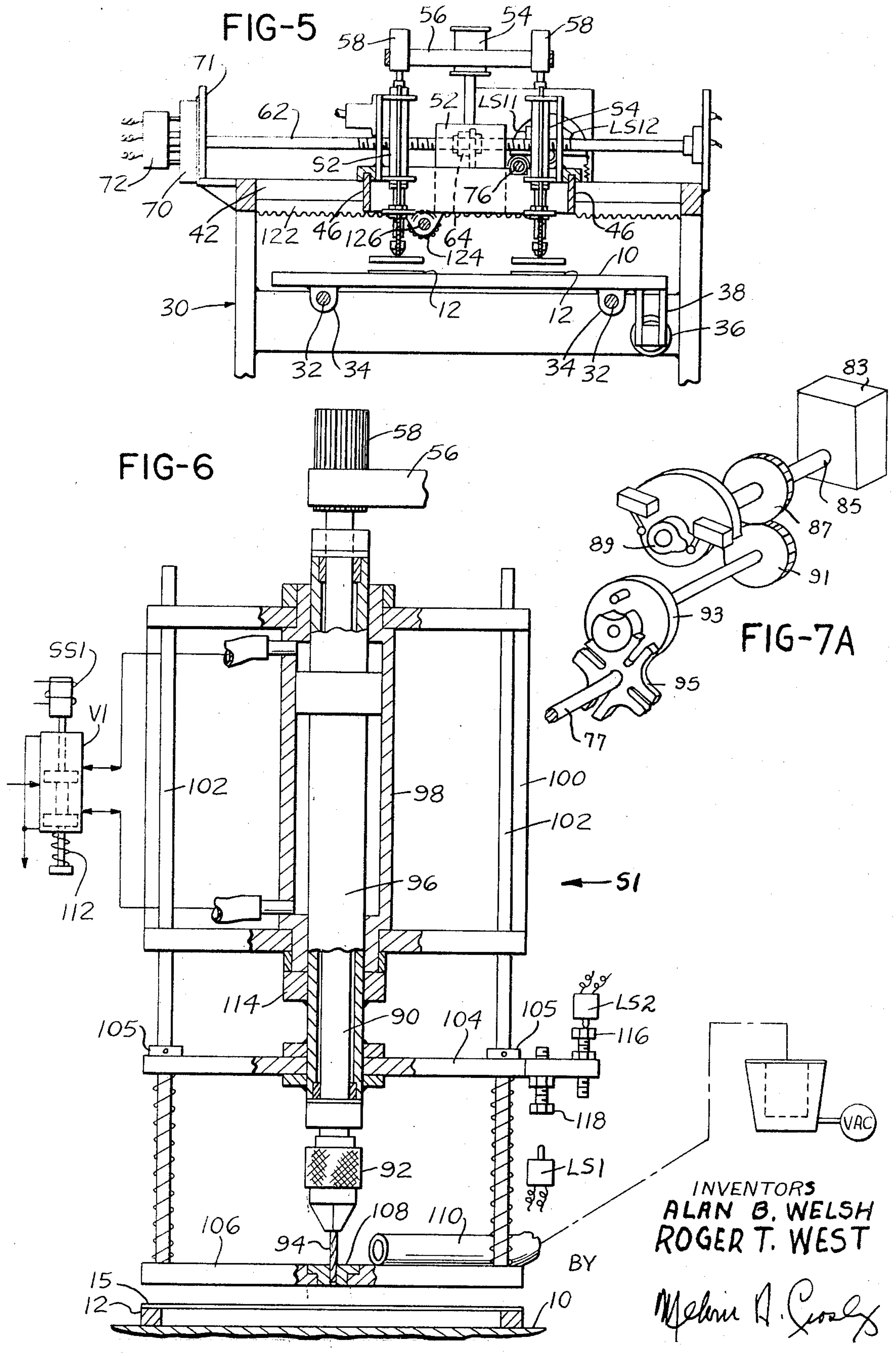
FIG. 5 is a view indicated by line V—V on FIG. 3 and taken at right angles to sectional line IV—IV.
FIG. 6 is a vertical sectional view indicated by line VI—VI on FIG. 3 showing a typical drilling spindle of the machine.
FIG. 7A shows a modification.

FIGS. 3, 4 and 5 taken together will show the mechanical structure of the machine. The machine comprises a stationary frame 30 having a pair of parallel guide rods 32 on which the aforementioned table 10 is reciprocably mounted. This may be accomplished by the sleeve members 34 fixed to the bottom of table 10 and slidably embracing the guide rods 32.

For reciprocating table 10, there is a fluid motor 36 connected between a point 38 on the table and a point 40 on frame 10 so that reversible energization of the said motor will cause reciprocation of table 10 on the frame of the machine between the two opposite end positions of the table. The motor 36 is hydraulically or pneumatically operable and is under the control of a solenoid operated valve, V5 having an actuating solenoid S5, as will be more clearly explained hereinafter.

The table 10 at its left end position closes a normally open limit switch LS13 and at its right end position closes a normally open limit switch LS14.

The frame 30 also has spaced parallel guide rails 42 fixed therein and extending at right angles to the guide rods 32. Guide rails 42 are availed of for supporting a frame 43 which is reciprocable in frame 30 in the direction of the rails 42. Frame 43 has members 44 in the opposite ends thereof slidably engaging guide rails 42 and holding frame 43 firmly on the said rails.

Frame 43, in turn, has longitudinally extending parallel guides 46 extending between and fixed to members 44 and extending at right angles to rails 42 and adapted for supporting carriage 18. Carriage 18 has guide members 48 along its opposite edges slidably engaging guides 46. By movement of frame 43 on guide rails 42 and by movement of carriage 18 along guides 46, the carriage can be caused to be positioned in any suitable location over the boards to be drilled.

Carriage 18 comprises a structure generally indicated at 50, extending between and fixed to the guide members 48 at the edges thereof and supporting the spindles S1, S2, S3 and S4 previously referred to. A single drive motor 52 is shown for driving the spindles. Drive motor 52 has an output pulley 54 about which is entrained a belt 56 that passes over pulleys 58 carried on the respective spindles and also around a spring biased tensioning roller 60 mounted in the carriage. By the described arrangement, all of the spindles are driven at one time in the same direction and at the same speed. Individual drive motors can also be provided for the spindles instead of a single motor, if desired.

For moving frame 43 on guide rails 42, there is provided a first screw 62, which may be in the form of a ball screw, and which engages a ball nut 64 carried by a bracket arrangement 66 mounted on frame 43 at one end thereof. One end of screw 62 is journalled at 68 in a bearing stationary on frame 10 and the other end thereof extends into a gear box 70, which also carries a reversible drive motor 72. Gear box 70 and motor 72 are supported on frame 10 by bracket member 71 fixed to the frame. Gear box 70 gears down the output shaft of motor 72 to screw 62 so that screw 62 will rotate relatively slowly. Also carried by the bracket 71 is a control arrangement 74, to be more fully described hereinafter, which controls the amount of rotation of the shaft 62 each time motor 72 is energized.

A further screw 76 is provided for moving the drilling carriage along guides 46 and this screw has one end journalled in a bearing 78 carried on one of the guide members 44 of frame 43 and its other end extending into a gear box 80 carried by bracket 66 mounted on the member 44 at the other end of frame 43. Gear box 66 is provided for reducing the speed of the output shaft of motor 82 to screw 76 so that screw 76 will rotate at a relatively low speed. Bracket 66 furthermore carries a control arrangement 84 similar to the control arrangement 74, referred to in connection with motor 72. It will be seen that by controlling the rotation of screws 62 and 76, the carriage 18 can be caused to occupy any desired drilling position within the limits of movement of the drilling carriage on its guides 46 and the frames 43 on its guide rails 42. Movement of the carriage by screw 62 is in the Y axis direction whereas movement of the carriage by screw 76 is in the X axis direction.

Each of the aforementioned drilling spindles is constructed in the manner illustrated in FIG. 6 which shows spindle S1 and wherein it will be seen that the spindle has a central shaft 90 having a respective pulley 58 on the upper end and a chuck 92 on the lower end for chucking a drill 94. Shaft 90 is journalled in a double acting piston 96 reciprocable in a stationary cylinder 98. Cylinder 98 is secured to a bracket member 100 that is attached to the structure 50 of the spindle carriage in any suitable manner.

Bracket 100 is availed of for supporting the guide rods 102 on opposite sides of the spindle and on which guide rods is slidably mounted a plate 104 carried by the piston 96 and moving therewith. Collars 105 on rods 102 abut the top of plate 104. Mounted on the lower ends of guide rods 102 is a pressure plate 106 adapted for pressing downwardly on top a circuit board therebeneath for a drilling operation. Plate 106 may carry a drill bushing 108 and a suction fitting 110 may be carried by plate 106 adjacent the upper end of drill bushing 108 for drawing off chips and shavings taken by drill 94.

The reciprocation of piston 96 in its cylinder 98 is under the control of a valve VI which is biased by a spring 112 in a direction to cause the piston to retract upwardly in its cylinder and is adapted for movement by energization of a solenoid SS1 into position to cause piston 96 to move downwardly in its cylinder. The supply of fluid to the cylinder controlled by the valve may be in the form of compressed air or a hydraulic fluid. Each spindle has a respective valve actuating solenoid SS1, SS2, SS3 and SS4.

The upper limit of motion of the piston in its cylinder may be determined by stop collar 114 of the piston, which is engageable with the lower end of the cylinder. A suitable stop can be provided to limit the downward movement of the piston in its cylinder if so desired.

Plate 104 can be availed of for carrying adjustable abutment 116 which is adapted for engaging a limit switch LS2 when the piston is in its uppermost position and an adjustable abutment 118 adapted for engaging a limit switch LS1 when the piston is in its lowermost position in the cylinder. In this way the completion of the up and down strokes of the piston can be monitored and other operations of the machine controlled in accordance therewith. Each spindle, as mentioned, has its own control valve and valve solenoid and also has its own position actuated limit switches. The upper and lower limit switches for spindles S2, S3 and S4 are designated LS3, LS4; LS5, LS6; LS7, LS8, respectively.

As will best be seen in FIGS. 4 and 5, the frame 43 is prevented from twisting on its guide rails 42 by the provision of racks 120 and 122 on the bottoms of rails 42. Each rack is engaged by a respective pinion 124, with the pinions being fixed to opposite ends of a shaft 126 rotatably carried by frame 43. It will be apparent that the pinions 124 and shaft 126 prevent twisting of the carriage of the frame 43 on its guide rails 42 by causing the opposite ends of the carriage to move at the same speed. For the purposes of exact alignment of frame 43 on its guide rails 42, the rack 122, shown at the right in FIG. 4, may be adjustably connected to its rail 42 as by the bracket arrangement 127 so that it can be shifted longitudinally at least a small amount and thereby adjust one end of frame 43 relative to the other end thereof.

By presetting this rack in the longitudinal direction, exact alignment of the frame 43 can be affected and thereafter the alignment will be accurately maintained by the racks 122, pinions 124 and shaft 126.

Figure 7:
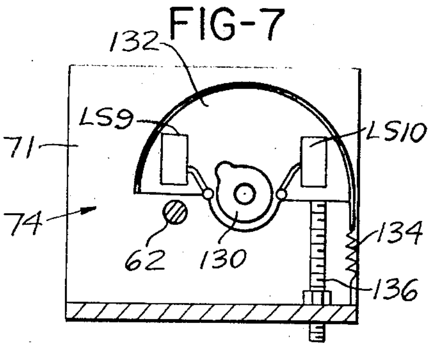
FIG. 7 is a view indicated by line VII—VII on FIG. 3 and showing a control arrangement employed in respect of one of the carriage shifting screws.

The control arrangement 74 for screw 62, and which is the same as control arrangement 84, is shown in FIG. 7. The control arrangement is in the form of a cam 130 driven by motor 72, and at such a speed relative to the pertaining screw 62 that the part driven by the screw will advance exactly one-tenth inch each for each revolution of the cam 130. The cam 130 in rotating, actuates limit switches LS9 and LS10, in sequence. These switches control the energization of the pertaining motor and cause the next step in the drilling cycle to commence as will be explained more fully hereinafter.

The switches LS9 and LS10 are mounted on a plate 132 which is tiltable about the axis of the shaft on which cam 130 is mounted. Plate 132 is biased in one direction by a tension spring 134 and the exact rotated position of the respective plate is determined by an adjustable abutment 136 which engages one side edge of the plate and against which abutment the plate is held by its spring 134.

The control arrangement for X axis screw 76 includes limit switches LS11 and LS12 which are also actuated in sequence.

In its left end position on the X axis, carriage 18 actuates a limit switch LS15 and in its right hand position actuates a pair of limit switches LS16 and LS17.

Similarly, when carriage 18 is moved on the Y axis to the top of FIG. 3, it actuates a limit switch LS18 and when moves to the bottom it actuates limit switches LS19 and LS20.

Figure 8:
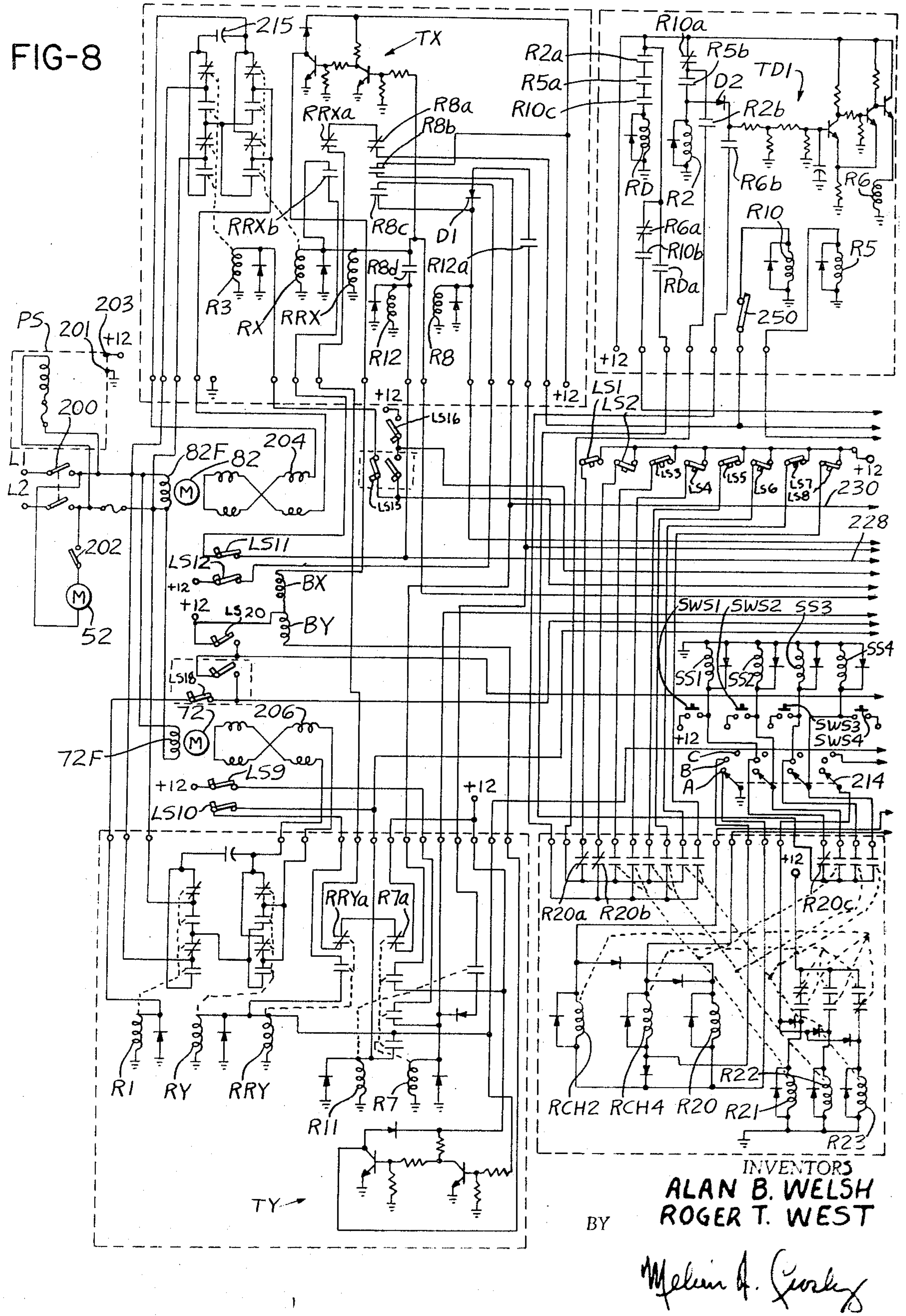
FIGS. 8 and 8A show the electrical control circuit for the machine.
Figure 8A:
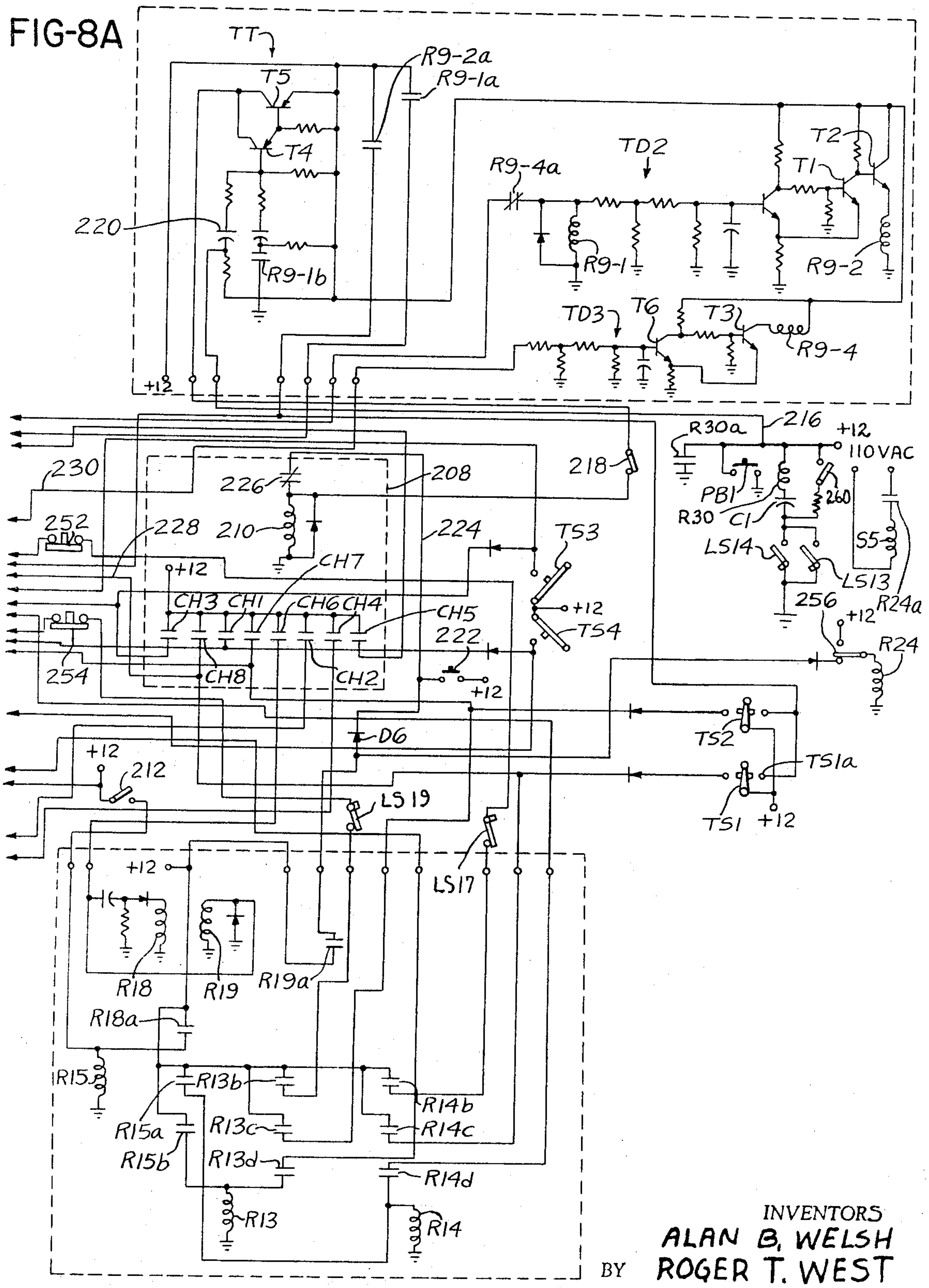

Referring now to FIGS. 8 and 8A, the electric control circuit for controlling the operation of the X axis and Y axis motors, the reciprocation of the spindles, the shuttling of the table, and the feeding of the control tape for the machine is illustrated.

In the circuit, power is supplied via power lines L1 and L2 at, say, 110 volts AC. The power lines are connected through an on-off switch 200 with the field coils 82F for the X axis motor 82 and 72F for the Y axis motor 72, and through a further on-off switch 202 to the spindle drive motor 52.

Power lines L1 and L2 on the output side of switch 200 are also connected with a power supply PS which has one terminal 201 connected to ground and another terminal 203 supplying direct current voltage at, say, 12 volts. In the circuit, all of the coils of the relays and the solenoids, with the exception of the field coils of motors 72 and 82 and solenoid S5, are supplied from terminal 203 and, as a matter of convenience, the points of the circuit so supplied are marked with a circle and +12.

The illustrated circuit comprises relays R3, RX, RRX, R12 and R8 peculiar to the X axis motor 82 and relays R1, RY, RRY, R11 and R7 which are peculiar to the Y axis motor 72. X axis motor 82 has associated therewith a magnetic brake having a coil BX which, when energized, brakes the motor and when de-energized releases the motor.

Similarly, Y axis motor 72 has a brake with an actuating coil BY. The supply of energy to the brake coil BY is under the control of a transistorized circuit TX and the supply of energy to brake coil BY is under the control of transistorized circuit TY, both of the said circuits being referred to hereinafter.

X axis motor 82 is a reversible shaded pole motor and is provided with shading coils 204, and Y axis motor 72, also a shaded pole motor, is provided with shading coils 206. These coils are adapted for being reversibly supplied with energy for reversible operation of the respective motors. It will be recalled that the motors operate in reversible directions, and the cams operated by the respective motors sequentially actuate limit switches LS11 and LS12 pertaining to X axis motor 82 and limit switches LS9 and LS10 pertaining to the Y axis motor 72.

In addition to the aforementioned relays and transistorized circuits peculiar to the respective X and Y axis motors and their brakes, the illustrated circuit includes general control relays in the form of relays RD, R10, R5, R6, R9–1, R9–2 and R9–4. Relay R6 has a transistorized time delay network TD1 connected thereto while relay R9–2 has transistorized time delay network TD2 connected thereto. Still further, relay R9–4 has a transistorized time delay network TD3 connected therewith.

A further transistorized network indicated at TT is provided for the purpose of supplying energy to the tape advancing coil to be referred to hereinafter.

The circuit embodies a group of relays that are employed only for the full automatic operation of the machine and these relays are indicated at R13, R14, R15, R18 and R19.

The circuit further embodies spindle selecting relays in the form of relays RCH2, RCH4, R20, R21, R22 and R23.

This circuit also comprises a reading head and tape advancing mechanism indicated in the dotted box 208. In the reading head is a series of switches CH1 to CH8, each of which has one side connected to the +12 volt supply and the other side connected to various relay coils to be controlled thereby. Each switch represents a column along a perforated tape fed through the head and which is advanced through the head in steps. At any step having a perforation in a given column, the pertaining switch is closed and, if there is no perforation, the pertaining switch will be open. The tape is caused to advance through the reading head by a known type mechanism which is actuated each time a tape advancing coil 210 is energized.

Relays R13, R14, and R15 are used to return the spindle carriage to the zero or starting position after completion of a drilling cycle. R15 activates relays R13 and R14, which latch closed and provide alternate and continuous paths to activate relays RX and Ry. The automatic step by Step sequence operation is omitted in runback. Switch 212 is a manually operated momentary push button on the control panel. Relay R18 is momentarily pulsed on by a hole in channel 6 of the tape at the end of a drilling cycle, and this activates R15 long enough such that R13 and R14 latch on by contacts R13D and R14D to cause the motor control circuits to run motors 72 and 82 back to the zero position. At a position one-tenth inch before zero, an adjustable abutment opens limit switches LS17 and LS20 (FIG. 8A) such that the latch on relays R13 and R14 is removed. The X and Y motors now complete their last revolution under sequential control of RY, RRY, R7, LS9 and LS10 for Y and RX, RRX, R8, LS11 and LS12 for X.

Normally closed momentary switches 252 and 254 provide manual control to break the latch circuit at a time other than zero, if desired, by an operator.

Pertaining to the relays RCH2, RCH4, R20, R21 and R23 which control the selection of the spindles which are to operate is a selector switch 214 having positions A, B and C which, as will be seen hereinafter, control the particular spindles that are to be effective for drilling holes during the operation of the machine.

To consider the operation of the machine, let it be assumed that selector switch 214 is resting in its position A. At this time, all of the spindle selection relays are de-energized so that blades **20*a*, 20*b* and 20*c*, pertaining to relay R20, are in their normally closed position when-ever the blades of relays R21, R22 and R23 are open. Blades 20*a* and 20*b*** are serially arranged with the limit switches LS1 and LS2 pertaining to spindle S1 which are normally closed and which open when spindle S1 reaches the top and bottom of its stroke respectively.

Assuming now that main control switch 202 is closed, power supply PS will be energized and its terminal 203 will go +12 volts positive. Furthermore, closing of switch 202 will establish an energizing circuit for spindle motor 52. Still further, fields 72F of the Y axis motor 72 and 82F of the X axis motor 82 will be energized.

The supply of energy to terminal 203 will bring about conduction of transistor T1 of time delay network TD3 which will make transistor T2 go non-conductive thereby preventing energization of relay R9–2. Simultaneously, the supply from terminal 203 will prepare transistor T3 of time delay network TD3 for subsequently energizing relay R9–4 to open its blade R9–4*a* through which relay R9–1 is energized. Blade R9–4*a* forms the input terminal of time delay network TD2.

Turning to the control relays for the X axis motor 82, the blades of relay R3 are connected through a condenser 215 with the shading coils 204 of motor 82. When relay R3 is energized, the armature of motor 82 rotates in the direction to cause the spindle carriage to move to the left and when relay R3 is de-energized the direction of current to coils 204 will cause the armature of motor 82 to run in the opposite direction and move the spindle carriage toward the right.

The blades of relay RX, when RX is energized, complete the circuit to shading coils 204 and when de-energized interrupt the circuit. Relay R3 is thus a directional relay and relay RX is a run relay.

The same comments pertain with respect to relays R1 and RY for the Y axis motor 72 in that relay R1 is a directional relay and relay RY is a run relay.

The further relay RRX of the X axis motor has a normally closed blade RRXa and relay RRY has a normally closed blade RRYa. Relay R8 of the X axis motor has a normally closed blade R8*a* and relay R7 of the Y axis motor has a normally closed blade R7*a*. These blades are serially connected between the +12 volt source and the coil of relay R10 so that when terminal 203 of the power supply goes positive, relay R10 will close.

It is assumed that the tape is resting at this time on an unperforated region so that none of switches CH1 to CH8 close. The tape can be caused to index to its next position by closing a pushbutton PB1 which will cause a wire 206 to go to ground thereby causing transistor T4 of the network TT to conduct which in turn will cause transistor T5 to conduct thereby supplying energy through a switch 218 to tape advancing coil 210. Due to condenser 220, the conduction of the transistor network TT is momentary so that the tape will advance a single step.

If it should be the case that the tape is to be advanced more than a single step, a pushbutton 222 can be closed which will supply energy through a wire 224 and normally closed contacts 226 to coil 210. The mechanism operated by coil 210 opens blades 226 when the mechanism is operated by the coil so that as long as switch 222 is held closed, tape will advance rapidly. In either case, the tape is advanced until it reaches a starting position.

For the sake of simplicity, let it be assumed that the spindle carriage is to advance on step toward the right on the X axis then drill a single hole in a circuit board beneath spindle S1. To accomplish this, the first operative position of the tape will cause switches CH8 and CH5 to close while leaving the others of the switches open. Closing of switch CH5 will energize relay R5, causing its blades R5*a* and R5*b* to close but which, at this time, are without effect. The closing of switch CH8 will supply energy through wire 228 to relay R12 and cause the single blade R12*a* thereof to close.

At the instant just after the tape mechanism has advanced such that CH8 and CH5 close, relay R9–1 is held closed. Time delay TD2 has completed a timing cycle such that R9–2 is closed and blades R9–2A are closed. Contact R12A has +12 applied to it which closes R8 via diode D1. R8 is now latched through contacts R8C and normally closed limit switch LS12. At the instant R8 closed, blades R8B closed to supply +12 volts to the input of TD3. Also at the instant R8 closed, wire 228 supplied +12 volts through now closed blades R8D to relays RX and RRX. At this instant the run relay RX supplies current to motor 82, and brake circuit TX releases brake coil BX such that motor 82 now starts to turn. Before cam lobe 130 (FIG. 7) moves away from LS11, LS11 contacts are held open.

Now as the motor rotates, LS11 closes and there are now two conduction paths to energize relays RX and RRX. At the end of the short time delay TD3, relay R9–4 energizes such that blades R9–4A open and relay R9–1 opens, blades R9–1A and R9–1B open, and relay R9–2 opens. With the opening of R9–2A, relay R8 no longer has a current path through contacts R12A, and R8 is latched solely by a path through R8C and LS12. When blades R9–1A open, relay R10 opens. When motor 82 has turned one-half revolution, the cam driven thereby, and corresponding to cam 130 of FIG. 7, forces LS12 open so that relay R8 opens, and upon reclosure of LS12, as the motor continues past LS12, R8 remains open. RX and RRX now are held closed solely by a path from wire 228, through blades LS11 and RRXB. When the motor completes one revolution, the lobe on the cam opens the limit switch LS11 and breaks the path to RX and RRX. When RX opens, motor 82 stops and brake BX is turned on. Brake BX eliminates inertial overshoot of the carriage 18 and rotating components on lead screw 76.

When RX and RRX open, at which time the carriage is now positioned with spindle S1 over a desired location to be drilled, the sequence is as follows: As before stated, R5 is closed. During the rotation of motor 82, relay R10 was open and, thus, contact blades R10A are in their normally closed position and with R5B also closed, R2 is closed. R6 is also closed after a very short time delay TD1. Delay TD1 is for the purpose of reducing so called "race" conditions of contacts R6A and R10B. This condition is well known in switching circuit design.

R6 is latched on by R6B, R20B, and LS2. With R2A and R5A closed, RD is open and RDA contacts are also open. When motor 82 stops at the end of one revolution, relay R10 is closed. R10C contacts now complete a path to relay RD so that contacts RDA activate solenoid SS1 to cause spindle S1 to move downward and drill a hole. As the spindle reaches the bottom of its stroke, abutment 118 (FIG. 6) opens limit switch LS1 which opens relay R2. Contacts R2A now open and relay RD opens so that solenoid SS1 causes spindle S1 to return upward. As the spindle reaches its uppermost position, abutment 116 opens limit switch LS2. When LS2 opens, R6 opens.

Contacts R6A now return to their normally closed state and a path is now complete from +12 through R6A, R10B, R9–4A to close relay R9–1 and contacts R9–1B close to cause transistors T4 and T5 to conduct a pulse tape reader coil 210 and advance the tape one step. The time length of TD2 is sufficient that the step advance has been completed and any appropriate contacts CH1 to CH8 have closed or opened reliably at the new row of perforations of the tape commands. At the end of time of TD2, relay R9–2 closes to send voltage through contacts R9–2A to the selected motor control circuit relay contacts R12A and/or R11A. This completes one automatic cycle sequence.

If no hole is to be drilled, CH5 stays open while the motor 82 runs through its cycle and as a result R6 remains open, and contacts R6A then remain normally closed. When motor 82 stops and relay R10 closes, contacts R10B close to complete the path to R9–1. Thus when no hole is to be drilled, the tape is advanced immediately after the axis motors revolve and stop.

The circuitry is the same for the Y axis drive motor 72, and because of the series path from terminal 203, or +12V, through R7A, RRYA, R8A, and RRXA, both motors, if commanded to run by channel switches CH7 and CH8, must revolve and stop before the tape can advance or a hole can be drilled. If there is a mechanical failure of the motor or spindle drive mechanism, the sequence stops and waits for operator attention.

With reference to spindle selection, if neither of switches CH2 or CH4 close and selector switch 214 is in its A position, only spindle S1 will operate.

If, with switch 214 in its A position, switch CH2 closes, then relays RCH2 and R20 will be energized and this will bring about that relay R21 is energized and only spindle S2 will operate.

If switch CH4 closes, then relays RCH4 and R20 will be energized and this will result in energization of relay R23 and only spindle S4 will operate. If both switches CH2 and CH4 close, then relays RCH2, RCH4 and R20 will be energized resulting in energization of relay R22 and only spindle S3 operating.

If now, the selector switch is set on position B, valve solenoids SS1 for spindle S1 and SS2 for spindle S2 will be connected in parallel and valve solenoids SS3 for spindle S3 and SS4 for spindle S4 will be connected in parallel.

Under these conditions, if neither switch CH2 or CH4 closes, then spindles S1 and S2 will operate in unison. If, on the other hand, switch CH4 closes, this will result in spindles S3 and S4 operating.

With selector switch 214 set in position C, relays R21, R22 and R23 will be energized, and neither of switches CH2 or CH4 will close, and all four of the spindles will operate in unison.

The cycle as described previously involves the reading of the tape step by step until a complete cycle of operations is completed whereupon the machine will halt unless the tape is prepared for full automatic operation.

Automatic operation of the machine can be provided for by availing of switch CH6. For automatic operation, a tape perforation for CH6 after the last hole is drilled will cause momentary energization of relays R18 and R19. Energization of relay R18 will bring about energization of relay R15 and closing of its blades R15*a* and R15*b*. As explained, energization of relay R15 will cause energization of relays R13 and R14 to cause automatic retraction of the carriage to its starting position. Energization of relay R19 will close to close its blade R19*a*. The closing of blade R19*a* will supply current via a diode D6 to interrupter contacts 226 of tape advancing coil 210 and cause the tape to advance one or more step, according to a desired program.

Simultaneously, with the closing of blade R19a, current is also supplied to the coil of ratchet relay R24 having a blade **R24*a* in circuit with the solenoid S5** for the table shift cylinder so that the valve pertaining to the table shift cylinder is shifted to cause the table to move to its opposite end position.

When the table and carriage are returning to the starting position thereof, the tape is resting on a blank, or unperforated region. When the carriage reaches zero position and relays R7 and R8 drop out, relay R10 closes, and the tape advances a step. Also, when the table reaches an end position, it closes one of limit switches LS13 and LS14, if switch 260 is closed, relay coil R30 is momentarily energized to close its blade **R30*a*, and a drop in voltage will be transmitted across capacitor C1 to wire 216 which will bring about momentary conduction of transistor T5 of network TT and supply a pulse of actuating current to tape advancing coil 210 which will advance the tape another step. The two steps of the tape never occur simultaneously. The second step of the tape brings it to a new starting position and may commence a new cycle of operations. Opening of switch 260 will prevent the tape step due to table shifting and, instead, switch PB1** can be actuated to cause the tape to advance a step.

In addition to the aforementioned toggle switch TS1 for the X axis motor, there is another toggle switch TS2 for the Y axis motor and each of these toggle switches has a position where the run relay for the respective motor will be energized thus providing for manual operation of the X and Y axis motors.

Further, the X axis motor is provided with a toggle switch TS3 and the Y axis motor with a toggle switch TS4 by means of which the direction of rotation of the respective motor can be selected during manual operation.

Each spindle is provided with a manual switch for permitting manual lowering of the respective spindle and these switches are indicated at SWS1, SWS2, SWS3 and SWS4.

Further manual switches are indicated at 250 in circuit with the coil of relay R10 for stopping the operation of the machine at any time. Switches at 252 and 254 are provided for controlling the X and Y axis motors during run back. A manual switch is also provided at 256 for controlling the operation of the table.

In FIG. 7A, a modification is illustrated in which a ball screw for actuating the carriage, said screw being indicated at 77, is actuated through a Geneva mechanism. In FIG. 7A, the drive motor shown at 83 and, through its output shaft 85, it drives a gear 87 and a switch controlling cam 89. Gear 87 meshes with a gear 91 which drives the input member 93 of a Geneva mechanism having an output member 95 with four slots therein.

In FIG. 7A, screw 77 has a pitch of two and one-half threads per inch so that one-fourth revolution of the screw, as brought about by a single revolution of the motor output shaft, will produce one-tenth inch of advancing movement. In such a case, the ratio between gears 87 and 91 is one to one. For screws of a different pitch, a different ratio exists between gears 87 and 91. For example, for a five pitch screw, a two to one ratio would exist between the gears and the screw would turn two quarter revolutions for one revolution of the input member 93 of the Geneva mechanism. For a 10 pitch screw, the screw would make four quarter revolutions for each complete revolution of the drive motor and the ratio between gears 87 and 91 would, in such a case, be four to one.

An advantage of the FIG. 7A construction is that no brake is needed to bring the motor and, therefore, the ball screw driven thereby, to a halt. The ball screw will be precisely positioned by the Geneva mechanism and the precise stopped position of the motor is, therefore, not critical.

From the foregoing, it will be apparent that the described circuit provided for full automatic operation of the machine, semi-automatic operation thereof, or manual operation thereof and with operation of the spindles singly or in groups.

Modifications are possible within the scope of the appended claims.

We claim:

1. In a drilling machine especially for drilling holes in printed circuit boards and in which the holes are located at points of intersection of the lines of a grid pattern with a predetermined uniform spacing between the lines of the grid pattern in each direction: a frame, a workpiece supporting table in the frame, means on the table adapted to receive workpiece means in the form of at least one circuit board which is to be drilled and supporting said board in a predetermined position on said table, a drilling carriage in the frame above the table having spindle means therein, first motor means connected between said carriage and spindle means for moving the spindle means toward and away from said table for drilling operations, second and third motor means connected to at least one of said carriage and table for causing relative movement between said carriage and table in respective angularly related directions corresponding to the direction of the lines of said grid pattern of the circuit board on said table, and control means for controlling the energization of said first, second and third motor means, said control means being operable to prevent energization of said first motor means during energization of either of said second and third motor means and to prevent energization of either of said second and third motor means during energization of said first motor means whereby relative movement of said carriage and table and drilling of workpiece means on the table occur sequentially, said control means also being operable upon the energization of either of said second and third motors to cause relative movement between said carriage and said table an amount equal to the said spacing between the lines of the grid pattern in the respective direction, said control means including means operable to effect an incident of energization of at least one of said second and third motor means following each incident of energization of said first motor means, said control means also including a tape-like control element and a reading head through which said tape-like control element is movable, said reading head including switch elements controlled by said tape-like element, feed means to advance said tape-like control element step by step through said reading head, each stepped position of said tape-like control element along a predetermined length thereof corresponding to a said incidence of energization of at least one of said second and third motor means and at least some of said stepped positions of said tape-like element also corresponding to an incident of energization of said first motor means.

2. A drilling machine according to claim 1, which includes means operable to brake said carriage and table against relative movement in a respective direction when the said second or third motor means pertaining to the said direction is deenergized.

3. A drilling machine according to claim 1, in which said second and third motor means are operatively connected between said frame and said carriage and said table is reciprocably mounted on said frame, said table having two workpiece supporting regions thereon spaced in the direction of movement of the table on said frame, and fourth motor means connected between said frame and said table operable for shuttling said table between two operative end positions thereof for selectively presenting one or the other of said workpiece supporting areas of the table to said spindle means.

4. A drilling machine according to claim 3, in which said control means includes means under the joint control of said tape-like control element and a respective said switch element for energizing said fourth motor means after a series of said incidents of energization representing the total number of work operations required to completely drill workpiece means on said table so as to shuttle said table to its opposite end position.

5. A drilling machine according to claim 4, in which said control means also comprises means for energizing said second and third motor means simultaneously with said fourth motor means so as to return said carriage to a predetermined starting position simultaneously with shuttling of said table from one end position thereof to the other.

6. A drilling machine according to claim 3, in which said carriage includes a first part supporting said spindle means and a second part on which said first part is slidably supported for movement in one of said angularly related directions, said second part being slidably supported on said frame for movement in the other of said angularly related directions, said second motor means comprising a first screw journaled on said second part and a first nut threaded on said first screw and connected to said first part of said carriage and a first reversible motor connected to said first screw, said third motor means comprising a second screw journaled on said frame and a second nut threaded on said second screw and connected to said second part and a second reversible motor connected to said second screw.

7. A drilling machine according to claim 6, in which said control means includes a rotatable cam driven by each reversible motor and a limit switch actuated thereby and operable to deenergize the respective motor after the screw driven thereby has rotated a predetermined amount whenever the respective motor is energized in a respective stepped position of said tape-like element.

8. A drilling machine according to claim 7, in which each said cam operated limit switch is supported for angular adjustment about the axis of rotation of the respective rotatable cam for adjustment of the exact stopping point of the pertaining said screw.

9. A drilling machine according to claim 7, in which said control means includes a run relay for each said reversible motor energizable for energizing the respective motor and a directional relay energizable for one direction of rotation of the motor and deenergizable for the other direction of rotation of the motor, said reading head including a respective switch element connected in controlling relation to each of said directional relays.

10. A drilling machine according to claim 9, which includes limit switches actuated by said first and second parts of said carriage in each extreme position thereof, said limit switches being connected in circuit with said directional relays and the respective switch elements therefor and when actuated controlling the energization of said directional relays to permit movement of the respective part in a direction away from the respective extreme position only when the respective reversible motor is energized.

11. A drilling machine according to claim 1, in which said spindle means comprises a plurality of spatially distributed spindles, and said first motor means comprising a first motor for each spindle.

12. A drilling machine according to claim 11, in which said table is reciprocably mounted on said frame, fourth motor means connected between said frame and said table for shuttling said table between opposite end positions, said table having a pair of spaced workpiece supporting regions thereon and each thereof disposed under said spindles in a respective end position of said table.

* * * * *